United States Patent [19]

Lee et al.

[11] Patent Number: 5,035,415
[45] Date of Patent: Jul. 30, 1991

[54] SYSTEM FOR DETECTING THE ACCURATE POSITIONING OF SHEETS ALONG A FEED PATH BY USING CAPACITORS AS SENSORS

[75] Inventors: J. Kelly Lee; Jon Kriegel, both of Rochester; Thomas Stephany, Churchville, all of N.Y.

[73] Assignee: Eastman Kodak Company, Rochester, N.Y.

[21] Appl. No.: 553,051

[22] Filed: Jul. 16, 1990

[51] Int. Cl.$^5$ .................... B65H 7/02; G08B 13/26; G08B 21/00
[52] U.S. Cl. .................... 271/265; 271/227; 271/259; 340/563; 340/675
[58] Field of Search ............ 271/227, 258, 259, 265; 340/563, 674, 675

[56] References Cited

U.S. PATENT DOCUMENTS

| | | | |
|---|---|---|---|
| 2,673,340 | 3/1954 | Johansson et al. | 340/563 |
| 3,230,519 | 1/1966 | Metz et al. | 340/563 |
| 3,519,922 | 7/1970 | Nash et al. | 340/675 |
| 3,646,372 | 2/1972 | Snellman et al. | 340/675 |
| 4,258,326 | 3/1981 | Johne | 271/258 |
| 4,276,547 | 6/1981 | Bowen et al. | 340/675 |
| 4,738,442 | 4/1988 | Rodi et al. | 271/261 |

FOREIGN PATENT DOCUMENTS

| | | | |
|---|---|---|---|
| 149053 | 6/1981 | German Democratic Rep. | 271/265 |
| 79/00257 | 5/1979 | PCT Int'l Appl. | 340/563 |
| 720447 | 3/1980 | U.S.S.R. | 340/563 |

Primary Examiner—Robert P. Olszewski
Assistant Examiner—Steve Reiss
Attorney, Agent, or Firm—John D. Husser

[57] ABSTRACT

An improved sheet-position detection system for apparatus having a sheet feed path and a use location(s). The position detection system includes a first capacitive sensor including a first pair of parallel plate members located in opposing relation on opposite sides of the feed path plane and centered on a desired lead sheet edge position. A second capacitive sensor includes a second pair of parallel plate members that are located in opposing relation on opposite sides of the feed plane and are centered on a desired trail sheet edge position. A bridge circuit applies potentials across the pairs of plate members in a circuit configuration such that output signals of the first and second sensors are subtracted, and when the combined outputs of the first and second sensors is zero, a feed sheet is indicated to be centered between the sensor means.

6 Claims, 2 Drawing Sheets

SYSTEM FOR DETECTING THE ACCURATE POSITIONING OF SHEETS ALONG A FEED PATH BY USING CAPACITORS AS SENSORS

FIELD OF THE INVENTION

The present invention relates to detection systems for use in accurately positioning a sheet along a feed path, and more specifically, to such a system employing a plurality of capacitive sensors to detect the uniquely desired positions for fed sheets.

BACKGROUND ART

A wide variety of detection systems have been employed to sense proper or improper conditions of sheet feed along a use path, e.g. the path of original or copy sheets feed in copier apparatus, the feed path of documents to be scanned by input scanner devices or the feed path of print sheets within printing machines. Conditions which have been detected by such systems include (i) position error (e.g. longitudinal error, lateral position error and skew error), (ii) double sheet feed or incorrect sheet thickness and (iii) improper sheet type (e.g. transparency vis a vis opaque sheet). The type and sensitivity of the detection system utilized depends on the kind of machine in which the system is used and the error condition that is to be detected.

U.S. Pat. Nos. 3,230,519; 3,591,922; 3,646,372 and 4,258,326 disclose the use of capacitive sensing devices to detect the presence or absence of dielectric objects, a variation in thickness because of a web splice and the existence of a double sheet feed. Capacitive detection devices have heretofore been employed in system configurations that enable detection of abrupt changes in feed material thickness but have not been used for accurate positioning detection.

U.S. Pat. No. 4,738,442 discloses the use of two adjustable lead edge photosensor elements which detect proper positioning of a print sheet feed into the grippers of a printer feed table. Prior art photodetection devices of the kind mentioned above can all function well in expected nominal conditions; however, difficulties can arise when deviations from the nominal occur. For example such systems can experience errors when the light reflected from the sensed sheet varies, e.g. because of sheet reflectance variation or a decrease in emitted light.

In many printing, copying and scanning applications, it is important that fed sheets be very accurately positioned. For example, in situations where different color image portions are to be placed on print or copy sheets during successive passes, accurate positioning is necessary to assure proper register of the different color image portions. When data is to be printed in proper register on a preprinted form or personalized printing is to be added to advertising literature, accurate positioning of the blank form or advertising signature sheet is important. In systems where input scanners merge data from separate input documents, accurate relative location information can require accurate positioning of the input and output sheets.

SUMMARY OF INVENTION

An important purpose of the present invention is to provide an improved system for obtaining the accurate positioning of a fed sheet at a predetermined use location. An important advantage of the invention is that its detecting of correct position is operable with various types of sheet medium, e.g. paper or transparency media.

In one aspect, the present invention constitutes an improved sheet position detection system for apparatus having a sheet feed path and a use location(s). The position detection system comprises a first capacitive sensor including a first pair of parallel plate members located in opposing relation on opposite sides of the feed path plane and centered on a desired lead sheet edge position. A second capacitive sensor includes a second pair of parallel plate members that are correspondingly sized and spaced to the first plate members, are located in opposing relation on opposite sides of the feed plane and are centered on a desired trail sheet edge position. A bridge circuit applies potentials across the pairs of plate members in a circuit configuration such that output signals of the first and second sensors are subtracted, and the system includes means for detecting when the combined outputs of the first and second sensors is zero, indicating that a fed sheet is centered between the sensor means.

BRIEF DESCRIPTION OF DRAWINGS

The subsequent description of preferred embodiments refers to the accompanying drawings wherein.

DETAILED DESCRIPTION OF PREFERRED EMBODIMENTS

Figure 1:
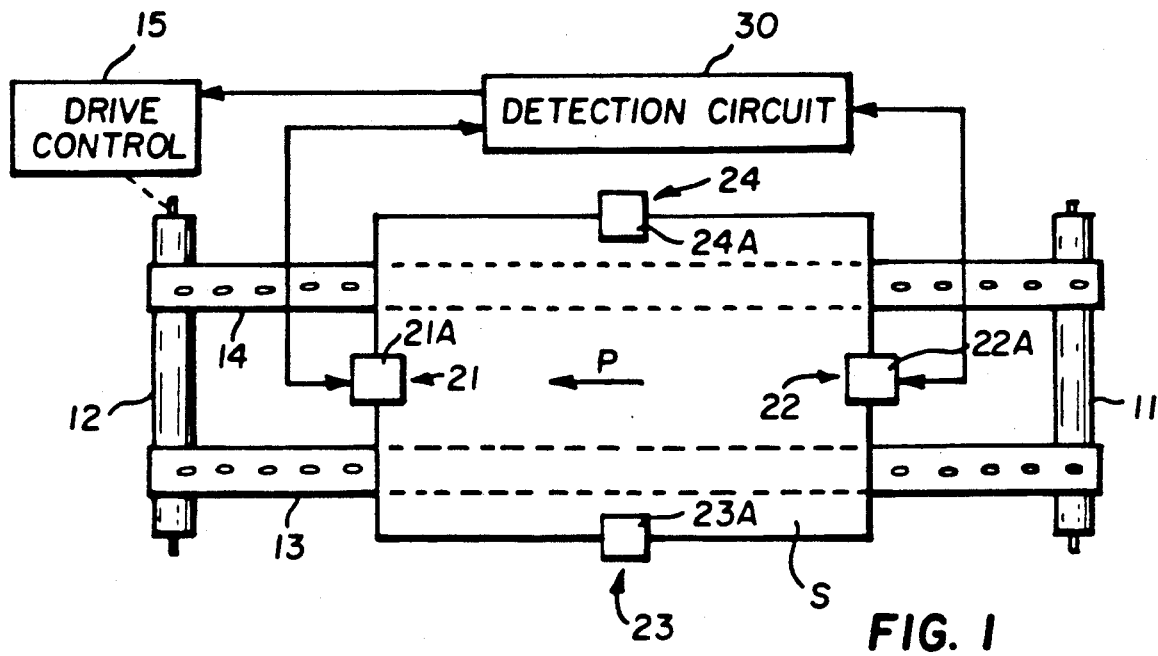
FIG. 1 is a top view of sheet feed apparatus employing one preferred embodiment of a sheet position detection system in accord with the present invention.
Figure 2:
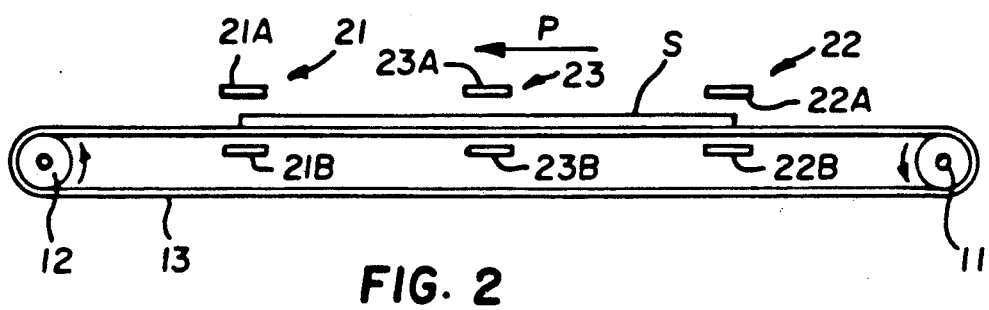
FIG. 2 is a side view of the FIG. 1 sheet feed apparatus and detection system.

FIGS. 1 and 2 illustrate one embodiment of the present invention constructed to operate with a sheet feed device 10, which can be a subsystem of a copier, printer, scanner or similar apparatus. The sheet feed device 10 comprises a pair of rollers 11, 12 by which vacuum belts 13, 14 are driven to transport a sheet S along a feed path P, from right to left as viewed in FIGS. 1 and 2. For example, roller 12 can be driven by a drive control system 15, such as a stepper motor and associated motor control circuitry.

The position detection system of the FIGS. 1 and 2 embodiment comprises leading and trailing edge sensing means 21, 22 and sheet side edge sensing means 23, 24. Each of the sensing means comprises a pair of equally sized capacitor plates spaced in parallel opposing relation on opposite sides of the feed path P. In FIGS. 1 and 2 the plates comprising respective sensing means are denoted with sub characters "a" and "b", e.g. plates 21a and 21b comprise sensing means 21. In one preferred sensing means construction, the plates are formed of phosphor bronze alloy, have major dimensions of about 1"×2", and are spaced about 0.30 inches.

In general, the capacitative sensing means should be sized and spaced so that, when a potential is applied across the spaced plates, the capacitance of the unit varies in direct proportion to the amount of sheet material therebetween. Specifically, the capacitance of each sensor means will increase as sheet material moves increasingly into the gap between the plates and will similarly decrease as the sheet material moves out of the gap between the plates.

As shown in FIGS. 1 and 2, the leading and trailing sensing means 21 and 22 each comprise a pair of equally sized plates, and those pairs are spaced apart along the feed path P a predetermined distance that depends on the length of the particular sheet to be detected. Specifically, the plates of sensing means 21, 22 are located so their midpoints along the feed path direction are spaced a distance equal to the sheet length. In this way, there will be a unique sheet feed position where the leading sheet edge is midway along the direction of sheet feed between the plates of sensing means 21 and the trailing sheet edge is similarly midway between the plates of sensing means 22. Of course, the sensing means 21, 22 can be adjustable along the sheet feed direction to accommodate different length sheets in the same manner as shown in FIGS. 1 and 2.

The side edge sensing means 23 and 24 are located with respect to the sheet feed path in regard to the width of the sheet S to be detected, so that when the sheet is in proper transverse alignment its side edges are midway between respective plates of the sensors 23, 24. The direction perpendicular to the sheet feed direction. The sensors 23, 24 also can be adjustable to provide different transverse spacings to accommodate different sheet sizes.

Figure 3:
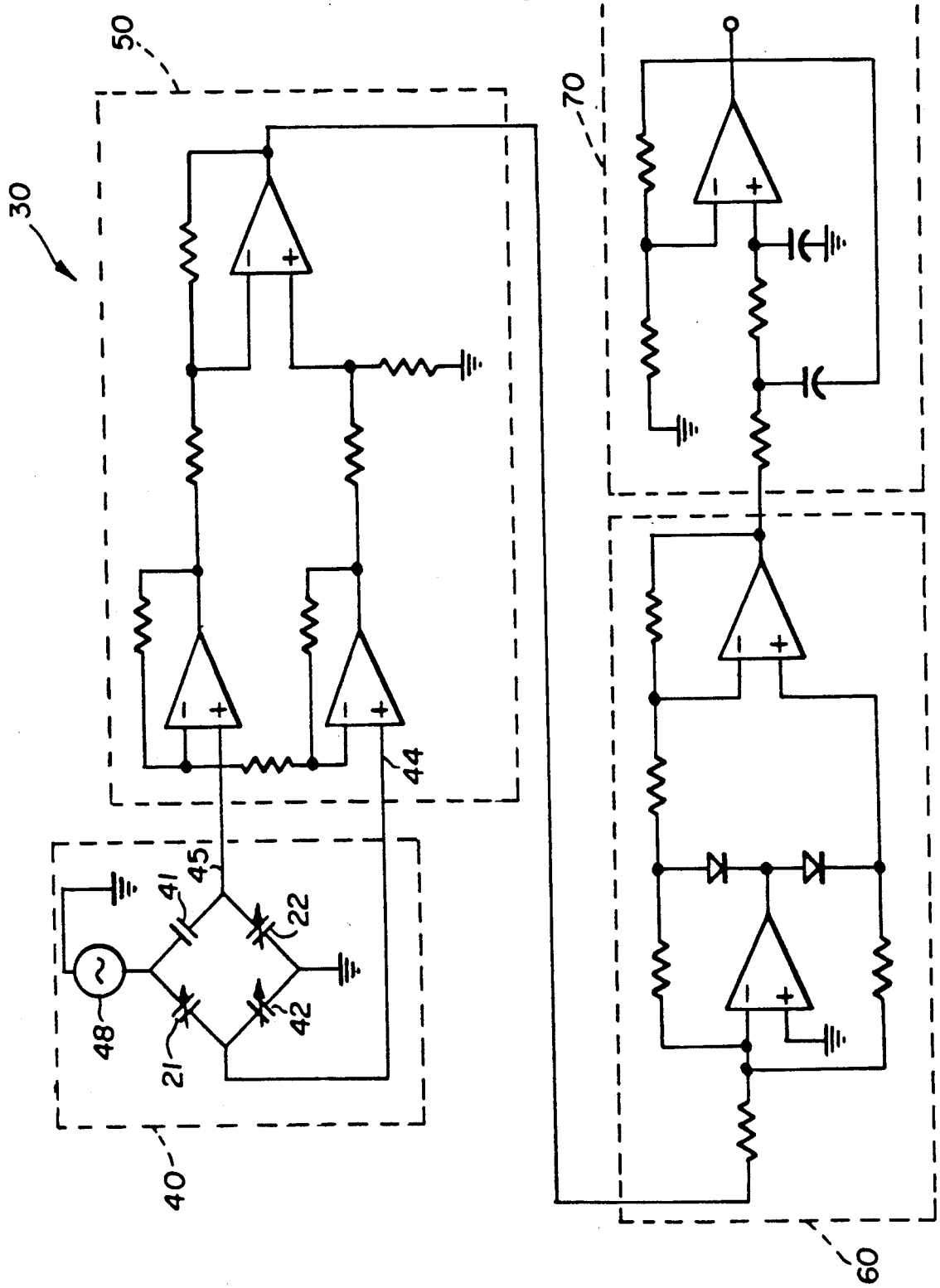
FIG. 3 is a schematic circuit diagram of one embodiment of a detection circuit useful in accord with the present invention.

One preferred mode in which leading and trailing edge sensing means 21, 22 function can be further understood by reference to FIG. 3, which shows schematic details of a preferred detection circuit 30. The detection circuit 30 comprises a bridge circuit 40 and differential amplifier circuit 50 and, preferably, a rectifier 60 and filter circuit 70. As shown in FIG. 3, the circuit 40 comprises a potential source 48 and is constructed to apply potential to sensors 21, 22 in a capacitative bridge, which also incorporates capacitor 41 and balance adjust capacitor 42 as shown. The output lines 44, 45 from the bridge circuit are applied to the inputs of differential amplifier 50.

The bridge circuit configuration allows the outputs of sensors 21, 22 to be subtracted from one another by differential amplifier 50, whose output is amplified, rectified by circuit 60 and filtered by circuit 70 to produce a detection voltage signal Vo. The detection signal Vo goes from positive to negative and crosses zero voltage when the leading and trailing edges of sheet S are located precisely equally between the plates of sensor 21, 22 respectively. At the zero crossing of the output signal Vo, the capacitance of sensors 21, 23 is precisely equal. This indicates that the sheet S is precisely at the desired position, with its leading edge at the longitudinal midpoint of sensor 21 and its trailing edge at the midpoint of sensor 22. If desired, the zero voltage signal can be employed to trigger drive control circuit 15 to stop sheet advance in a position where the sheet S is precisely located for commencement of copying, printing or scanning operations by the apparatus in which the system is employed.

The edge sensor means 23, 24 are incorporated in a bridge circuit like that of FIG. 3 and their outputs are similarly subtracted, amplified, rectified and filtered. However, the output of the circuit for the edge sensors is desirably maintained at zero with the sheet edges continually at the midpoints of the sensors 23, 24. When the signal from this circuit goes positive or negative, a feed error condition can be signalled, or a corrective tracking function can be initiated to direct the sheet in the proper direction to reattain the sheet centered, zero output signal condition.

The invention has been described in detail with particular reference to certain preferred embodiments thereof, but it will be understood that variations and modifications can be effected within the spirit and scope of the invention.

What is claimed is:

1. In apparatus having a sheet feed path along which sheets are to be accurately positioned at a use location(s), an improved sheet position detection system comprising:
    (a) first capacitor sensing means including a first pair of parallel plate members located in opposing relation on opposite sides of the feed path plane and centered on a desired leading sheet edge position,
    (b) second capacitor sensing means including a second pair of parallel plate members which are correspondingly sized and spaced to said first plate members in opposing relation on opposite sides of the feed path plane and centered on a desired trailing sheet edge position;
    (c) circuit means for applying potentials across said pairs of plate members in a circuit configuration such that output signals of said first and second sensing means are subtracted from one another; and
    (d) means for detecting when the difference of said first and second sensing means is zero, thereby indicating the location of a fed sheet is precisely centered between said sensing means.

2. The invention defined in claim 1 further comprising:
    (e) third capacitor sensing means including a third pair of parallel plate members located in opposing relation on opposite sides of the feed path plane and centered on a desired left sheet edge position;
    (f) fourth capacitor sensing means including a fourth pair of parallel plate members which are correspondingly sized and spaced to said third plate members in opposing relation on opposite sides of the feed path plane and centered on a desired right sheet edge position;
    (g) circuit means for applying potentials across said third and fourth pairs of plate members in a circuit configuration such that output signals of said third and fourth sensor means are subtracted; and
    (h) means for detecting when the difference of said third and fourth sensor means is zero, thereby indicating the location of a fed sheet as centered transversely on the feed path.

3. In apparatus having a sheet feed path along which sheets are to be accurately positioned at a use location(s), an improved sheet position detection system comprising:
    (a) first capacitor sensing means including a first pair of parallel plate members located in opposing relation on opposite sides of the feed path plane so as to sandwich therebetween a desired leading sheet edge position;
    (b) second capacitor sensing means including a second pair of parallel plate members which are located in opposing relation on opposite sides of the feed path plane so as to sandwich a desired trailing sheet edge position;
    (c) circuit means for applying potentials across said pairs of plate members in a circuit configuration such that output signals of said first and second sensing means are subtracted from one another; and (d) means for detecting the difference of said first and second sensing means and indicating that the location of a fed sheet is at a predetermined location between said sensing means.

4. The invention defined in claim 3 further comprising:
(e) third capacitor sensing means including a third pair of parallel plate members located in opposing relation on opposite sides of the feed path plane so as to sandwich therebetween a desired left sheet edge position;
(f) fourth capacitor sensing means including a fourth pair of parallel plate members which are located in opposing relation on opposite sides of the feed path plane so as to sandwich a desired right sheet edge position;
(g) circuit means for applying potentials across said third and fourth pairs of plate members in a circuit configuration such that output signals of said third and fourth sensor means are subtracted; and
(h) means for detecting the difference of said third and fourth sensor means and indicating the location of a fed sheet as predeterminedly located, transversely, on the feed path.

5. In apparatus having a sheet feed path along which sheets are to be fed accurately, an improved sheet position detection system comprising:
(a) left side capacitor sensing means including a pair of parallel plate members located in opposing relation on opposite sides of the feed path plane and centered on a desired left sheet edge position;
(b) right side capacitor sensing means including a pair of parallel plate members which are correspondingly sized and spaced to said left side plate members in opposing relation on opposite sides of the feed path plane and centered on a desired right sheet edge position;
(c) circuit means for applying potentials across said left side and right side pairs of plate members in a circuit configuration such that output signals therefrom ar subtracted; and
(d) means for detecting when the difference of said left side and right side sensor means is zero, thereby indicating the location of a fed sheet as centered transversely on the feed path.

6. In apparatus having a sheet feed path along which sheets are moved to a use location(s), an improved sheet position detection system comprising:
(a) first capacitor sensing means including a first pair of parallel plate members located in opposing relation on opposite sides of the feed path plane at an upstream position;
(b) second capacitor sensing means including a second pair of parallel plate members which are predeterminedly sized and spaced to said first plate members in opposing relation on opposite sides of the feed path plane at a downstream position such that a fed sheet can span said first and second pairs of plate members;
(c) circuit means for applying potentials across said pairs of plate members in a circuit configuration such that output signals of said first and second sensing means are subtracted from one another; and
(d) means for detecting when the difference of said first and second sensing means is zero, thereby indicating a predetermined location of the lead edge of a fed sheet.

* * * * *